Feb. 7, 1961 F. W. SCHWARZ 2,970,730

DICING SEMICONDUCTOR WAFERS

Filed Jan. 8, 1957 3 Sheets-Sheet 1

INVENTOR.
Friedrick W. Schwarz
BY Mueller & Aichele
Attys.

Feb. 7, 1961 F. W. SCHWARZ 2,970,730

DICING SEMICONDUCTOR WAFERS

Filed Jan. 8, 1957 3 Sheets-Sheet 2

INVENTOR.
Friedrick W. Schwarz
BY
Mueller & Aichele
Att'ys.

Feb. 7, 1961 F. W. SCHWARZ 2,970,730

DICING SEMICONDUCTOR WAFERS

Filed Jan. 8, 1957 3 Sheets-Sheet 3

INVENTOR.

Friedrick W. Schwarz

BY

Mueller & Aichele

Attys.

United States Patent Office 2,970,730

Patented Feb. 7, 1961

2,970,730

DICING SEMICONDUCTOR WAFERS

Friedrich W. Schwarz, Phoenix, Ariz., assignor to Motorola, Inc., a corporation of Illinois Filed Jan. 8, 1957, Ser. No. 633,151

11 Claims. (Cl. 225—2)

This invention relates to methods of and apparatus for dicing semiconductor wafers, and more particularly to methods of and apparatus for scribing germanium and silicon wafers and breaking the wafers into dice.

In the manufacture of semiconductor diodes and transsistors, the semiconductor material such as silicon and germanium are crystallized by pulling or by zone leveling techniques into elongated crystals several inches in length and from about two to three inches in diameter, and the crystals then are cut into thin slices or wafers of the semiconductor material. The wafers, after being lapped, etched, and diffused if so desired, then are cut into very small dice often of square or oblong shape, usually of less than .06 inch in each dimension.

In the past, semiconductor wafers have been cut into dice using gang saws or ultrastonic cutters or by scribing and breaking the wafers. The use of gang saws has proved uneconomical due to waste of material caused by sawing and the slow speed of operation. Ultrasonic cutters are more efficient and produce less waste than gang saws but are considerably more expensive in original capital cost. The cutting of wafers into dice by scribing and breaking along scribe lines is inexpensive and produces little waste if performed accurately. However, it has proved quite difficult to scribe wafers accurately into dice of the desired rectangular or square size and shape. It has also proved difficult to break the scribed wafers and handle the dice produced with the equipment previously available. Relatively, these are very tiny light weight pieces to handle.

It is therefore one object of the invention to provide new and improved methods of and apparatus for scratching and breaking semiconductor wafers into dice.

Another object of the invention is to provide methods of and apparatus for scratch-dicing semiconductor wafers with a minimum of waste.

A further object of the invention is to provide methods of handling semiconductor wafers and dice formed therefrom.

One feature of the invention is the provision of apparatus for scribing semiconductor wafers along lines spaced one distance apart and then scribing the wafers along lines spaced different distance apart perpendicular to the first mentioned lines.

Another feature of the invention is the provision of apparatus for scratch-breaking semiconductor wafers including a table slidable relative to a scriber to form a line and shifting means for moving the scriber laterally of the table selectively one of two given distances.

Another feature of the invention is the provision of methods of scratch-breaking semiconductor wafers in which a wafer is placed on an elastic sheet of pressure-sensitive material, the wafer is scribed, the sheet then is flexed over an arbor to break the wafer along the scribed lines while retaining the resulting dice on the sheet for handling purposes, and then the dice are stripped from the sheet.

Referring now to the drawings.

The invention provides a scratch-dicing method and apparatus in which a wafer or slice of semiconductor material is placed on and stuck to a pressure-sensitive adhesive face of a sheet of thin flexible material and placed on a turntable of magnetic material for processing. The sheet holding the wafer is held on the table by small magnets placed at the edges of the sheet. The table is then slid repeatedly beneath a scriber which forms a series of parallel lines or scratches across the upper face of the wafer. After each first line is formed, an actuator shifts the scriber laterally a selected distance and the table is reciprocated to form another line. When the entire face of the wafer is scribed with parallel lines the table is turned 90°, and, if desired, the actuator may be set to shift the scriber a different given distance. Scratches are then formed in a similar manner perpendicular to the previously formed scratches to form a square or rectangular gridwork of dimensions suitable for dice to be used as transistors or semiconductor diodes.

The sheet and scribed wafer are then removed and placed on and bent around an arbor or breaking mandrel to crack the wafer along the lines extending in one direction. The arbor or mandrel is provided with ridges spaced apart the same distance as the scratches on the wafer. After the wafer has been broken into elongated strips, the supporting sheet is turned 90° and is flexed around a second arbor having ridges spaced apart at a distance equal to that between the lines running parallel thereto, so that the elongated strips of semiconductor material are broken into short dice. The sheet with the dice adhering gently thereto is then pulled through a slot of a stripper while an edge of the stripper scrapes the dice from the sheet and collects the dice in a shallow trough.

Figures 1, 3, 4:
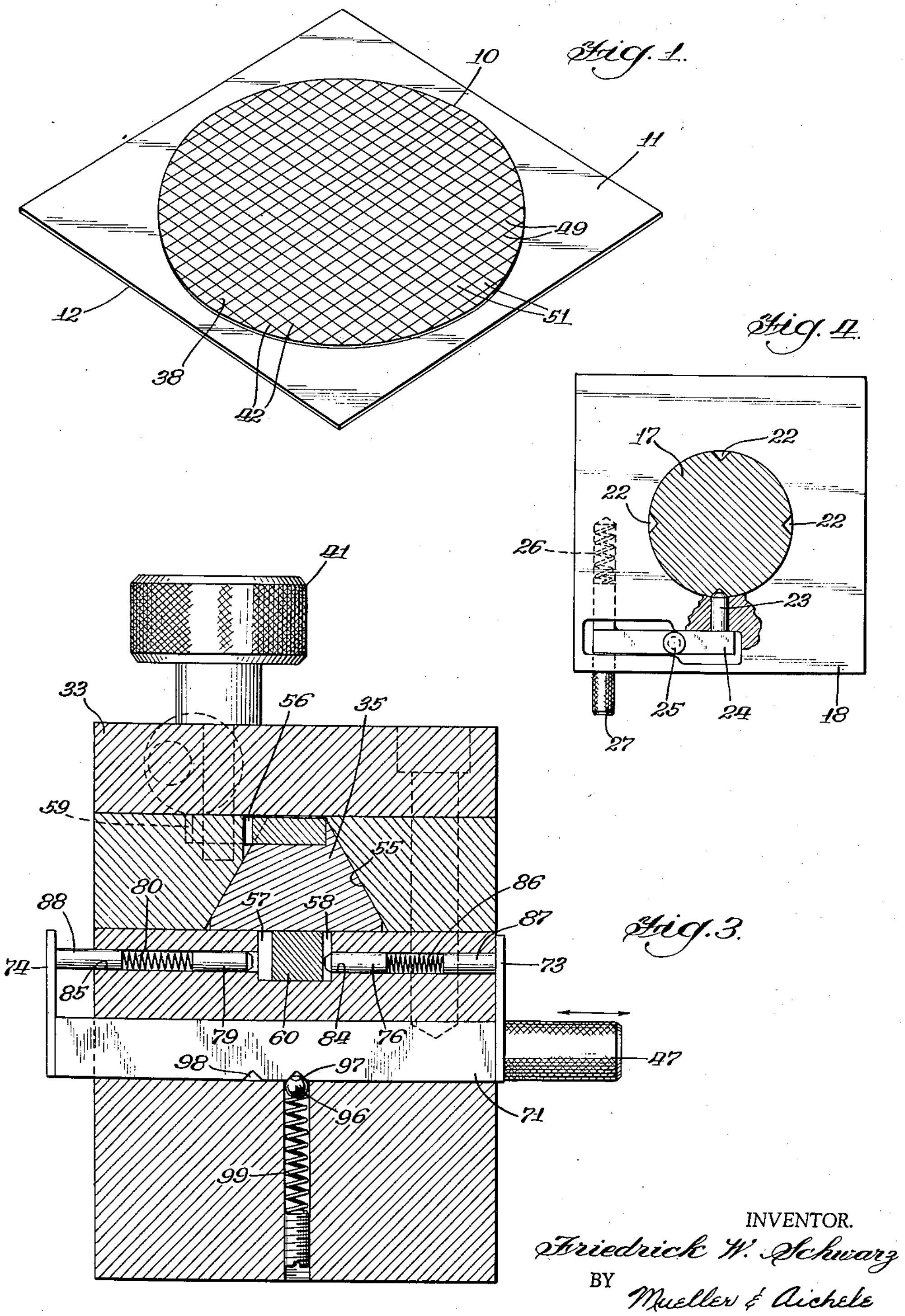
Fig. 1 is a perspective view of a semiconductor wafer and a carrying sheet therefor during one stage of a method forming one embodiment of the invention.
Fig. 3 is an enlarged vertical section of a portion of the apparatus shown in Fig. 2.
Fig. 4 is a horizontal section of a portion of the apparatus shown in Fig. 2.

Referring to Fig. 1 of the drawings, a slice or wafer 10 of semiconductor material of silicon or germanium and preferably of a thickness less than .008 inch, is placed on a pressure sensitive adhesive surface 11 of a thin flexible sheet 12. The material forming the surface 11 thereon is of a wellknown type of pressure sensitive adhesive material which may be easily cleaned from the semiconductor material of the wafer 10. One pressure sensitive adhesive sheet suitable for the sheet 12 is that produced by United Merchants & Manufacturers, Inc., of New York, N.Y., under the trade name "Con-Tact" a Comark Product. Equally suitable is "Marvelon" self adhering material produced by Kimberly-Clark Corp., Munsing, Michigan.

Figure 2:
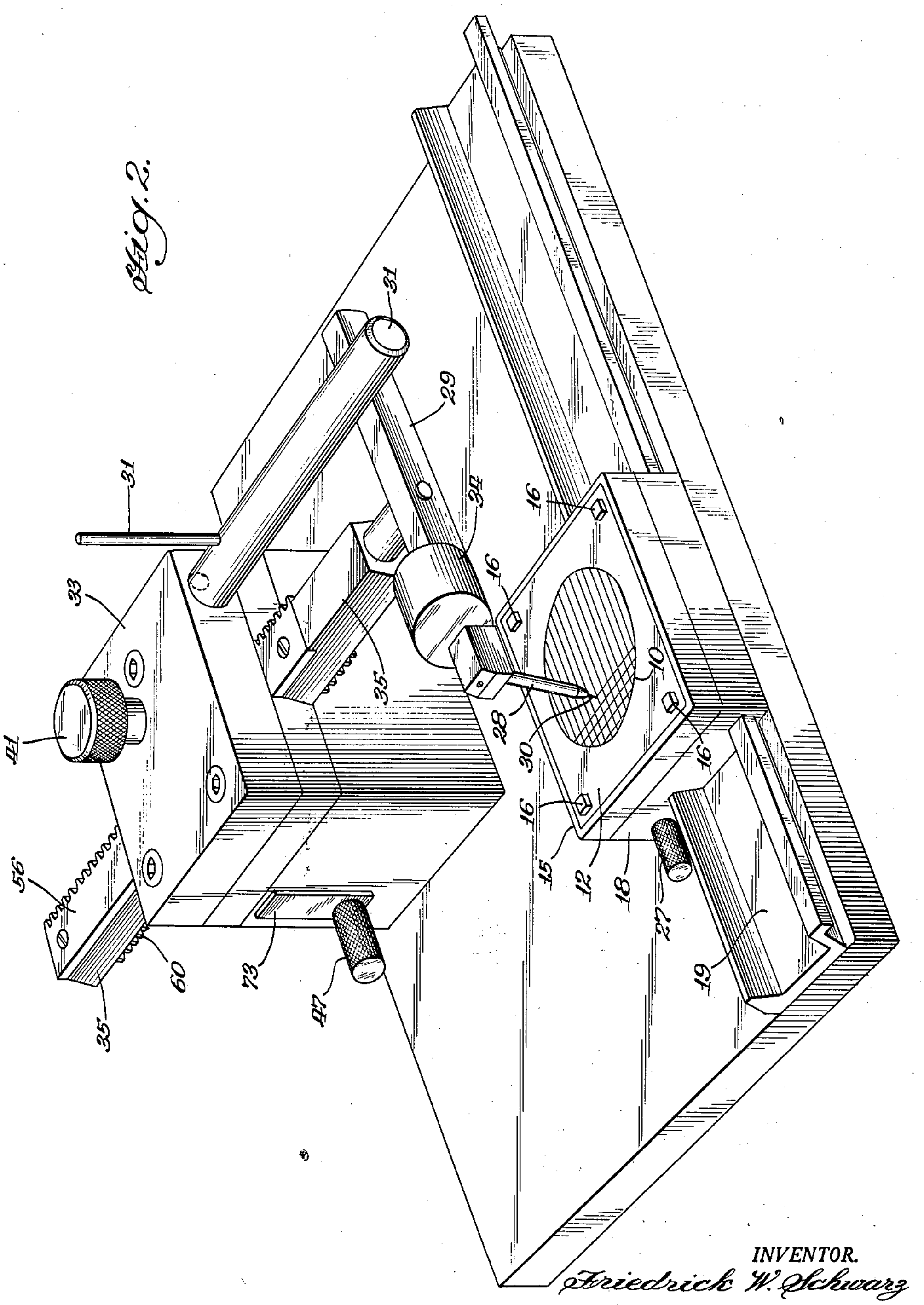
Fig. 2 is a perspective view of an apparatus forming one embodiment of the invention.

With the wafer firmly held by the sheet 12, such sheet is placed on a holder or turntable 15 (Fig. 2) of magnetic material, such as steel, for example, and small, strong magnets 16 which may be of "Alnico-v" or the like, are placed at the corners of the sheet and clamp the sheet securely to the turntable 15. The turntable 15 is rigidly secured to a post 17 (Fig. 4) mounted rotatably in a base or carriage 18 slidable along a guideway 19. The post 17 is provided with notches 22 located 90° from one another, and a latching pin 23 mounted on a lever 24 pivotal on a pin 25 is pressed by a compression spring 26 into the notch 22 to lock the turntable 15 against movement relative to the base 18. A release button 27 is secured to the lever 24, and when pressed, pivots the lever 24 to pull the detent or pin 23 out of the notch 22 it has entered to permit the turntable 15 to be turned relative to the base 18. The end of the detent 23 is a frustum whose sides make about a 90° angle with one another, and the sides of the notches 22 also form 90° angles for precise indexing of the turntable.

After the sheet 12 (Fig. 2) has been mounted on the turntable 15, a scriber 28 releasably mounted on a counter-weighted arm or lever 29 and having a silicon carbide or diamond tip or point 30 is permitted to move by gravity into engagement with the lower lefthand portion of the wafer 10 by a cam 31 having a handle 31*a* and mounted rotatably in a mounting block 33 to permit the point 30 to come into engagement with the wafer 10. A weight 34 is adjustable along the arm 29 to control the force of tip 30 against the wafer, the cam 31 being completely out of engagement with the lever 29. The arm 29 is mounted pivotally on a slide 35. The carriage 18 is moved downwardly along the guideway 19, as viewed in Fig. 2, and a first scratch 38 (Fig. 1) is formed on the upper surface of the wafer 10 to weaken the wafer 10 along the line or scratch 38.

After the scratch 38 is formed the cam 31 is rotated to lift the point 30 out of contact with the wafer 10 and the base 18 is moved back up the guideway 19. Then a knob 41 is turned to move the slide 35 to the right, as viewed in Fig. 2, a selected distance. The scriber 28 is lowered again into engagement with the wafer 10 and a second scratch or line 42 (Fig. 1) is formed parallel with the line 38. The scratching and formation of subsequent lines 42 all parallel to one another and all spaced the same distance apart is continued until the entire base of the wafer is scribed or divided by the lines 38 and 42 into elongated strips.

The button 27 is pressed to release the post 17, and the post and the turntable 15 are turned 90° and the button 27 is released to permit the detent 23 to slide into the next notch 22. At this time the lines 38 and 42 are perpendicular to the guideway 19. Meanwhile, the slide 35 is moved completely back to its farthest lefthand position shown in Fig. 2 and an actuator 47 is actuated manually to change the movement of the slide 35 between subsequent lines, and lines 49 are formed on the wafer 10 perpendicular to the lines 38 and 42 in a similar manner to the formation to the lines 38 and 42, the only difference being that the lines 49 are substantially closer together than the lines 38 and 42 so that oblong dice 51 are scribed onto the wafer 10.

The mounting block 33 has a dove-tail guideway 55 (Fig. 3) along which the slide 35 is slidable, and is slid along the guideway 55 by a rack member 56 driven by the knob 41 and a gear 59 meshing with the rack 56 which is fixed to the upper portion of the slide 35. An indexing bar 60 fixed to the slide 35 has widely spaced notches 58 therealong and also has closely spaced notches 57. The notches 57 are spaced apart the distance desired to space apart the scribed lines 49 and the notches 58 are spaced apart the distance which is desired to space apart the lines 38 and 42.

The bar 60 may be selectively used by the actuator 47 to index the movement of the slide 35 to provide the desired movement of scriber 28. The actuator 47 includes a bar 71 (Fig. 3) slidable along a guideway in block 33 and having stop plates 73 and 74 at its ends. When the actuator 47 is slid to its farthest left-hand position, as viewed in Fig. 3, a spring-pressed detent or pin 76 carried thereby is pressed into one of the notches 58, and each time the knob 41 is turned the detent 76 is moved out of the notch 58 and then slides into the next notch 58 to stop movement of the slide 35. To form the lines 49 the actuator 47 is moved from the position shown in Fig. 3 to a position in which the stop plate 74 engages the block 33, in which position a detent 79 is pressed by a spring 80 into one of the notches 57 and similarly limits the travel of the slide 35 when actuated by the knob 41. The detents 76 and 79 are slidable in bores 84 and 85 along with springs 80 and 86 and pins 87 and 88. When the bar 71 is in its lefthand position, the spring 80 is not compressed while the spring 86 is compressed and holds the detent 76 against the bar 60. The converse is true when the slide is in its furthermost righthand position in which the plate 74 presses the pin 88 into the bore 85. A ball-detent 96 is pressed by a spring 99 into either a notch 97 or a notch 98 to hold the bar 71 in either its lefthand position or its righthand position. When the bar is moved manually to these positions end portions of the detents 76 and 79 respectively, are formed at angles of about 103° and the walls of the notches 57 and 58 form angles of 103° for precisely indexing the slide 35. It has been found that if these angles are 120°, the indexing is poor and if the angles are 90° the indexing is not good either.

Figure 5:
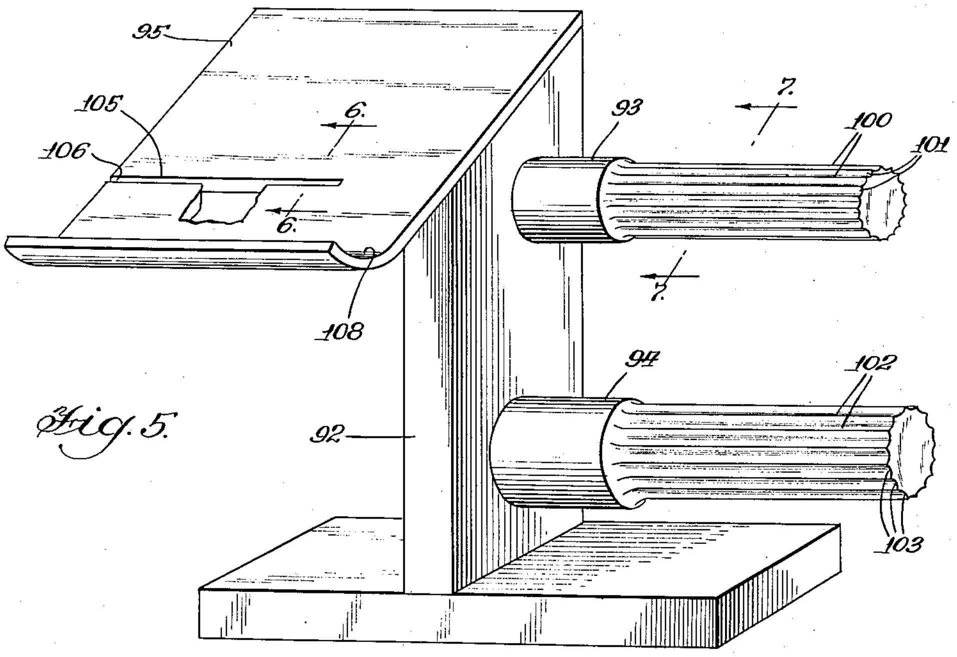
Fig. 5 is a perspective view of a device for effecting a portion of the method.

A dicing or breaking fixture (Fig. 5) includes a base and a mounting panel 92 having breaking arbors 93 and 94 secured rigidly to a side of the panel. A stripper plate 95 is secured to the upper end of the plate or panel 92. The arbor 93 has sharp ridges or edges 100 thereon formed by flutes or grooves 101 and the ridges 100 are spaced apart the same distance as the distance between the scribed lines 49 (Fig. 1). The arbor 94 (Fig. 5) has sharp ridges or edges 102 thereon formed by flutes 103 extending along the arbor. The ridges 102 are spaced apart the same distance as that of scribed lines 38 and 42.

Figures 6, 7:
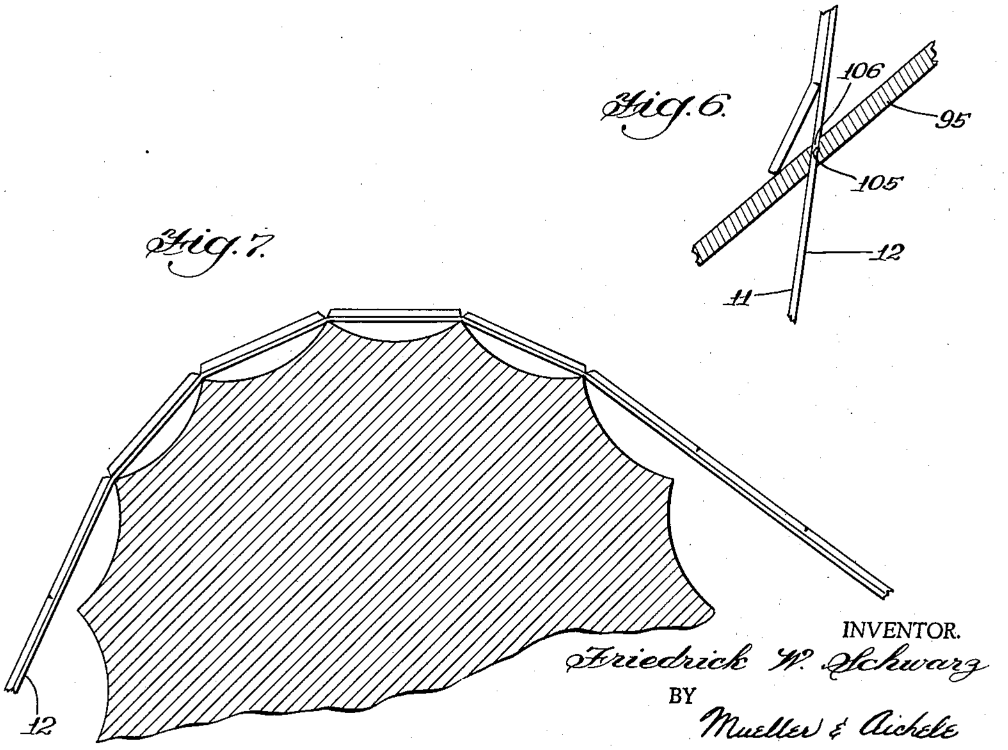
Fig. 6 is a vertical section taken along line 6—6 of Fig. 5.
Fig. 7 is a vertical section taken along line 7—7 of Fig. 5.

After the wafer 10 has been scribed or scratched as described above, the magnets 16 (Fig. 2) are removed, and the sheet 12 with the scribed wafer 10 is taken from the turntable 15 and is placed manually on the arbor 93 with one of the lines 49 directly above the uppermost ridge 100 on the arbor 93, the wafer being above the sheet 12. Then the edges of the sheet 12 laterally disposed relative to the arbor 93 are pushed downwardly while maintaining the sheet 12 under tension and the wafer 10 is broken along the scratch lines 49 by the ribs or ridges 100 (Fig. 7). The thinness and elasticity of the sheet 12 permits the sheet 12 to be formed around the arbor 93, and the pressure sensitive adhesive face of the sheet 12 holds the long narrow strips formed by the breaking along the lines 49 in the same position on the sheet 12 as they were when joined together. Then the sheet 12 is turned 90° and is placed on the arbor 94 with the wafer separated by the sheet from the arbor and with one of the lines 42 placed directly over the uppermost ridge 102. The lateral edges of the sheet 12 are manually pulled down with the sheet being maintained taut, and the wafer 10 is broken along the lines 38 and 42 by the ridges 102 to complete the formation of the dice (Fig. 1). The dice are still held by the pressure-sensitive adhesive surface of the sheet 12.

The lower edge of the sheet 12 is slipped into a slot 105 of the stripper plate 95 from the side and top thereof. The sheet 12 is pulled downwardly and forwardly, as viewed in Fig. 6, completely through the slot 105. The slot 105 is of a thickness just sufficient to permit the sheet 12 to be pulled therethrough but will not permit the dice 51 to be pulled through with the sheet. A scraping edge 106 of the slot 105 lifts the dice 51 from the pressure sensitive adhesive surface of the sheet 12 and the dice slide down the stripper plate 95 into a trough portion 108 thereof where the regularly shaped pieces are separated from the irregularly shaped edge pieces.

The degree of adhesiveness of the pressure sensitive adhesive surface of the sheet 12 is just sufficient to hold the dice thereon during the breaking operation by the arbors 93 and 94, and the dice are readily separated from the sheet 12 after they have been formed. The sheet 12 is very thin, which permits the flexing of the sheet on the arbors 93 and 94 and the ridges 100 and 102 to precisely break the wafer 10 along the lines 38, 42 and 49.

The dice are then washed in a suitable cleaning fluid, such as carbon tetrachloride, alcohol, or other suitable solvent to remove any pressure sensitive adhesive from the lower faces of the dice. However, there is very little of such pressure sensitive adhesive stuck to these faces of the dice. Then the dice may be processed in known ways to provide electrodes and assembled into diode or transistor assemblies of known construction.

The above-described method and apparatus form semiconductor dice accurately and quickly. There is very little waste in this method and the capital cost of the apparatus is low. In the previously used technique of cutting dice with a gang saw, the original cost of the equipment was moderately low. However efficiency was low, and the operating costs were quite high per unit die produced. With an ultrasonic cutter, costing about twice as much as a gang saw, it was possible to obtain more usable dice from a single wafer. The operating cost of the ultrasonic cutter was also quite high per unit die produced.

The apparatus of my invention for carrying out this method of forming semiconductor dice is small and easy to operate. The original cost of the apparatus is only a small fraction of the cost of a gang saw or of an ultrasonic cutter. Using this apparatus an ordinary semiconductor wafer can be very quickly broken into more usable dice than with any prior apparatus and method. With a gang saw or an ultrasonic cutter only a small fraction of the dice can be produced that are produced by this process. It is therefore apparent that this apparatus and method is substantially cheaper, both in capital and in labor costs, than processes and apparatus previously used.

I claim:

1. A method of scratch-dicing semiconductor wafers which incudes, mounting a semiconductor wafer to be diced to one face of a sheet of flexible material, scratching the wafer along parallel lines extending in one direction, scratching the wafer in parallel lines normal to the first mentioned parallel lines, and flexing the sheet with the wafer secured thereon on a supporting surface to break the wafer along one of the lines while retaining the severed pieces on the sheet.

2. A method of scratch dicing a semiconductor wafer which includes, securing a wafer to a flexible sheet, scribing a line on the wafer, placing the sheet with the wafer thereon, against a support having a sharp edge with the scribed line adjacent to the edge, and flexing the sheet and wafer against the edge to break the wafer along the line scribed thereon while retaining the severed pieces on the sheet.

3. A method of scratch-dicing a semiconductor wafer which includes, mounting a semiconductor wafer on a pressure sensitive adhesive surface on a flexible carrier sheet, scribing parallel lines on the wafer to form the outline of semiconductor dice, and flexing the sheet and wafer against successive ones of a series of sharp edges spaced apart the same distance as the parallel lines scribed on the wafer to break the wafer along said scribed lines while retaining the severed pieces on the sheet.

4. A method of scratch-dicing semiconductor wafers which includes, mounting a semiconductor wafer to be diced on a pressure sensitive adhesive surface on a sheet of flexible material, scratching the wafer along parallel lines extending in one direction, scratching the wafer in parallel lines angular to the first-mentioned parallel lines, and flexing the sheet and wafer to break the wafer along said lines into small semiconductor dice while the dice are retained on the sheet.

5. A method of scratch-dicing semiconductor wafers which includes, securing a semiconductor wafer to be diced to a pressure sensitive adhesive surface on a sheet of flexible material, scribing the wafer along parallel lines extending in one direction, scribing the wafer in parallel lines normal to the first-mentioned parallel lines, and flexing the sheet with the wafer secured thereto along successive ones of said parallel lines against a support having a series of sharp edges spaced apart the same distance as the parallel scribed lines to break the wafer into dice which are retained on said sheet.

6. A method according to claim 5 in which the sheet and wafer are bent around the support a first time to break the wafer into elongated strips, and the sheet and wafer strips are then bent around the support normal to the strips to break the wafer strips into dice which are retained by the adhesive on said sheet.

7. A method of scratch-dicing thin wafers of hard frangible semiconductor material so as to provide from a single wafer a plurality of dice of a size in the order of .06 inch in each dimension or less, which includes, mounting a semiconductor wafer to be diced, scribing the wafer along parallel lines extending in one direction with the lines spaced apart in the order of .06 inch or less, scribing the wafer in parallel lines in a different direction with corresponding dimensions, flexing the wafer with a rotating member having an axis extending parallel to said one direction to break the wafer along the first mentioned parallel lines, flexing the wafer with a rotating member with the axis thereof extending along the second mentioned parallel lines to break the wafer into semiconductor dice, and retaining the wafer on a support of flexible material both during the flexing operations and subsequent thereto to facilitate handling of the small semiconductor dice thus formed.

8. A method of dicing semiconductor wafers which includes, providing a line scribed semiconductor wafer retained in fixed but removable relation on a support of flexible material to form a unit for handling purposes, the scribed lines of the wafer being in a first parallel set and a second parallel set transverse to said first set, flexing the wafer and the support therewith in one direction with an arcuate member to break the wafer along the first set of scribed lines while retaining the same on the flexible support, again flexing the wafer and the support therewith in another direction with an arcuate member to break the wafer into dice along the second set of scribed lines while retaining the same on the flexible support, and thereby providing a plurality of individually formed dice carried by the flexible support in an orderly arrangement to facilitate selection and handling of the dice.

9. A method of scratch dicing a thin wafer of hard frangible material to provide a plurality of minute dice, said method including the steps of repeatedly effecting relative movement of the wafer with respect to a line scribing member, with such scribing member sequentially engaging spaced portions of the wafer surface to form a series of scribed lines defining minute dice areas, effecting a flexure of the wafer by an arcuate member in a direction transverse to the scribed lines to accomplish a breaking of the wafer along such lines and into the dice, retaining the wafer on flexible support means during the flexure of the wafer with such flexible support means positioned between the wafer and the arcuate member and also retaining the wafer on such flexible support means subsequent to the flexure of the wafer to facilitate handling of the dice thus formed.

10. A method of dicing a thin hard wafer to form a plurality of dice of a size in the order of .06 inch in each dimension or less, including the steps of scribing a first set of parallel lines in the surface of the wafer with the spacing of such lines being in the order of .06 inch or less, scribing a second set of parallel lines in the surface of the wafer and normal to the first set of lines and with a spacing therebetween in the order of .06 inch or less, mounting the wafer on flexible support means, flexing the wafer by means of contact between the support means and an arcuate member in a direction transverse to the first set of lines and in a direction transverse to the second set of lines to break the wafer along such lines and form the plurality of dice, retaining the wafer on the flexible support means during the flexing operation, and subsequently separating the plurality of dice from the flexible support means for individual utilization of such dice.

11. A method of dicing a thin hard wafer to form a plurality of minute dice, including the steps of scribing under controlled pressure a first set of parallel lines in a surface of the wafer, scribing under controlled pressure a second set of parallel lines in the surface of the wafer and normal to the first set of lines thereby delineating the individual dice, aligning the wafer in first and second positions with respect to an arcuate member having a longitudinal axis respectively parallel to the first set of lines and parallel to the second set of lines, with the aforesaid surface of the wafer protected against direct contact by the arcuate member, flexing the wafer with the arcuate member in first and second positions of the wafer while maintaining pressure on the wafer by the arcuate member sufficient to break the wafer along said lines to form the plurality of dice, and retaining the wafer on a flexible support during the flexing and breaking operations and thereafter to facilitate selection and handling of the individual dice.

References Cited in the file of this patent

UNITED STATES PATENTS

| | | |
|---|---|---|
| 985,272 | Miller | Feb. 28, 1911 |
| 1,174,066 | Harris | Mar. 7, 1916 |
| 1,340,225 | Howard | May 18, 1920 |
| 2,053,375 | Nicholas | Sept. 8, 1936 |
| 2,087,806 | McCune | July 20, 1937 |
| 2,235,051 | Thompson | Mar. 18, 1941 |
| 2,261,062 | Huber et al. | Oct. 28, 1941 |
| 2,286,960 | Hall | June 16, 1942 |
| 2,555,916 | Clark | June 5, 1951 |
| 2,762,954 | Leifer | Sept. 11, 1956 |
| 2,775,023 | Hedding | Dec. 25, 1956 |
| 2,784,479 | Roberts | Mar. 12, 1957 |